United States Patent [19]

Weber

[11] 4,142,110
[45] Feb. 27, 1979

[54] CIRCUIT TO ELIMINATE DC BIAS

[75] Inventor: Rudolf Weber, Darmstadt-Eberstadt, Fed. Rep. of Germany

[73] Assignee: Fa. Weber Lichtsteuergeräte KG., Darmstadt, Fed. Rep. of Germany

[21] Appl. No.: 785,437

[22] Filed: Apr. 7, 1977

[51] Int. Cl.² ............................................. H03K 5/08
[52] U.S. Cl. ................................. 307/237; 307/264; 328/99; 330/11; 330/296
[58] Field of Search .............. 307/237, 264; 328/99; 330/296, 11

[56] References Cited
U.S. PATENT DOCUMENTS 3,553,486  1/1971  Dow .............................. 307/237 X Primary Examiner—John Zazworsky
Attorney, Agent, or Firm—Ernest F. Marmorek

[57] ABSTRACT

A passing circuit for coupling a signal portion and suppressing a DC component included in a composite input signal, includes a transistor having a substantially constant output signal for a variable input signal at a predetermined operating point, and biasing means connected to the transistor and operable for substantially maintaining the predetermined operating point at a value defining a constant output of the transition corresponding to the DC component to be removed from the input signal.

5 Claims, 6 Drawing Figures

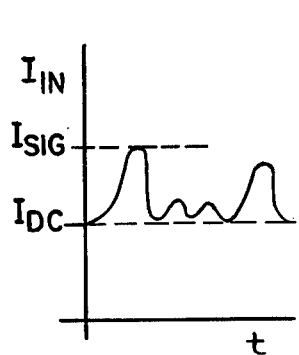
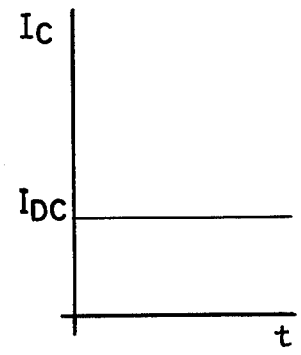
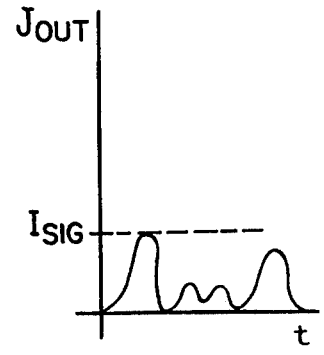
Fig 3A     Fig 3B     Fig 3C
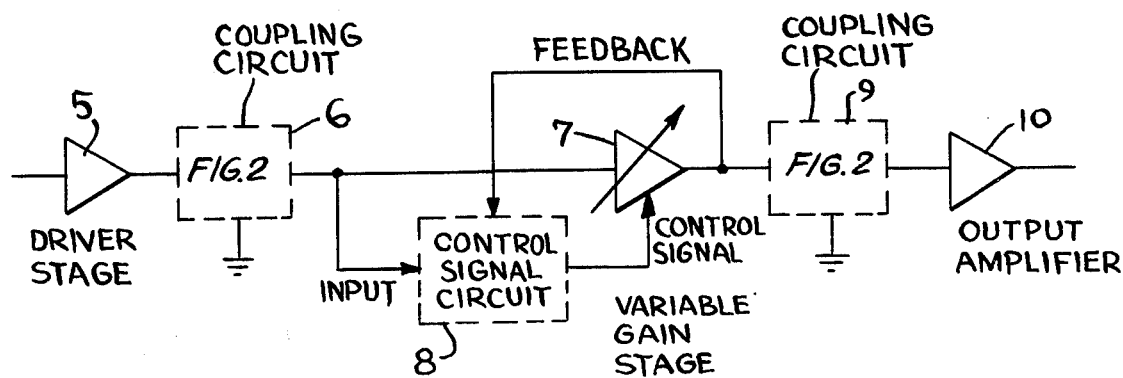
Fig 4

CIRCUIT TO ELIMINATE DC BIAS

BACKGROUND OF THE INVENTION

The invention relates to a coupling circuit for passing a signal component and removing any DC component included in a composite input signal.

Generally, an opto-electronic reading or detection system includes a sensor or detector followed by a signal amplifier and the decision-making logic system. For such systems, the reading speeds must have a capability over a range of practically zero to some given maximum speed. Such a broad range excludes the use of AC-coupled amplifiers. The use of a DC amplifier is suggested, but these amplifiers are limited by the amount of DC component present in the input signal.

The instant invention removes the DC component which might be present in a signal. In addition, the instant invention is suitable for use in successive stages which are fixed or variable gain amplifying stages in order to achieve a desired amplification of the signal component.

One of the principal objects of the present invention is a coupling circuit for removing a DC component from a composite signal having a predetermined signal range, including a transistor having a substantially constant DC output threshold for a variable drive signal at a predetermined operating region, biasing means connected to the transistor and operable for setting a controllable operating region defining the constant DC output threshold, the operating region corresponding substantially to the DC component of the composite signal, and being at least partially controllable by signals within the predetermined frequency range, and means for applying the composite signal as a driving signal to the transistor to remove from the composite signal the DC component lying below the threshold, and pass the signal component exceeding the threshold, the biasing means having a relatively high time constant with respect to the highest frequency within the frequency range of the composite signal to minimize control of the operating region by the composite signal.

It is advantageous if the coupling circuit includes an input terminal, and the transistor includes a biasing terminal; the biasing means preferably includes a divider circuit including first and second resistors connected between an operating voltage source of a predetermined polarity and ground, and coupled to the biasing terminal of the transistor.

It is further advantageous if the circuit includes rectifying means, such as a diode, connected between the resistors so as to normally pass current therethrough, and coupled to the biasing terminal of the transistor.

The biasing means preferably include a third resistor connected to the input terminal and the rectifying means, and a capacitor coupled to the biasing terminal of the transistor and to ground.

The coupling circuit may be advantageously interconnected between two amplifiers, so as to couple the amplifiers to each other.

BRIEF DESCRIPTION OF THE DRAWINGS

For a fuller understanding of the nature and the objects of the invention, reference should be had to the following detailed description, taken in connection with the accompanying drawings, in which:

FIGS. 3A, 3B and 3C show in current versus time curves the removal of the DC component in the circuit of FIG. 2; and FIG. 4 shows a another preferred system incorporating the instant invention.

DESCRIPTION OF THE PREFERRED EMBODIMENTS

In carrying the invention into effect, some embodiments have been selected for illustration in the accompanying drawings and description in the specification, reference being had to FIGS. 1 to 4.

Figure 1:
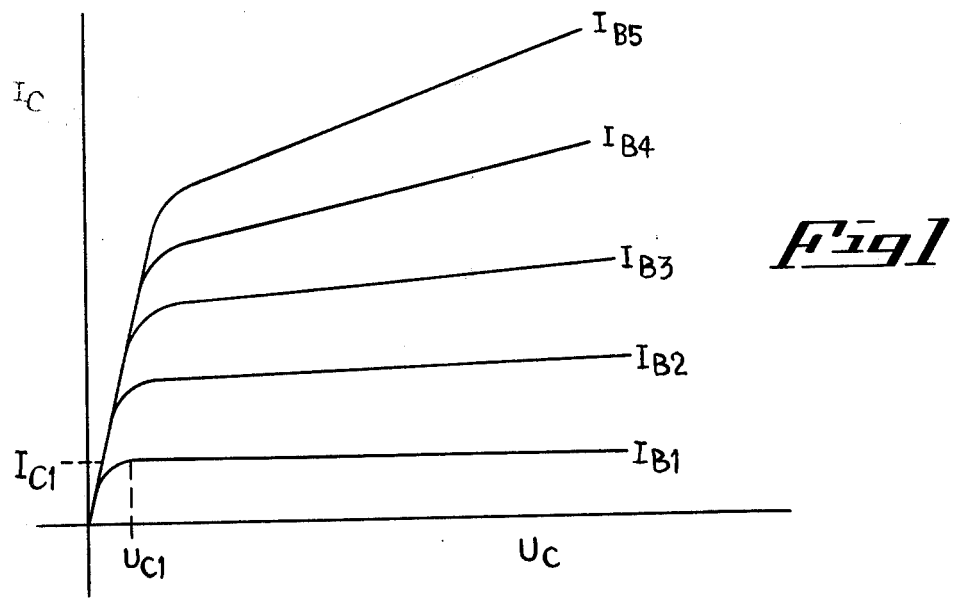
FIG. 1 shows typical characteristic curves for a transistor.

FIG. 1 shows a typical transistor characteristic curve in which an output signal such as collector current Ic is plotted versus a drive signal such as collector voltage ($U_C$) for various operating points defining by varying base current ($I_B$).

If a constant base current of $I_{B1}$ is selected, it is evident that the collector current will be substantially constant at $I_{C1}$ for low values of collector voltage greater than $U_{C1}$. Such relationship is typical for low bias values ($1_B$) for transistors including field effect transistors (FET's). For a FET, the controlling property is the gate voltage.

Figure 2:
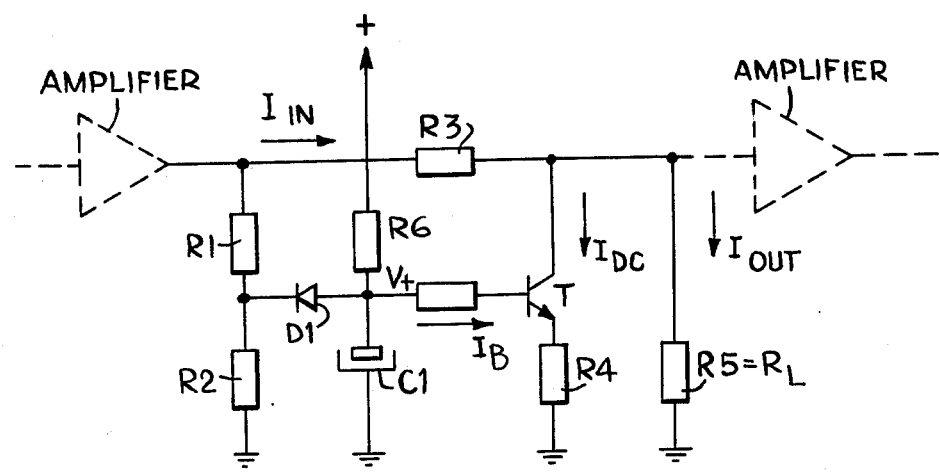
FIG. 2 is a preferred circuit according to the instant invention.

In FIG. 2, a composite input signal current $I_{IN}$ (FIG. 3A) after passing through a resistor R3 is divided into a substantially constant current $I_{DC}$ (FIG. 3B) passing through the transistor T and emitter resistor R4, and an output signal current $I_{OUT}$ equal to $I_{IN}$ minus $I_{DC}$ through the load resistor R5. The constant value of the collector current $I_C$ can be adjusted by setting the base current $I_B$ to be substantially equal to the $I_{DC}$ current (FIG. 3B) so that the output signal $I_{OUT}$ becomes equal to the component signal $I_{SIG}$ as shown in the FIG. 3C.

For this condition, the lowest value of the current $I_{IN}$ equals the current $I_{DC}$ and the operating range of the transistor is made self-regulating through the use of a diode $D_1$ connected between the divider formed by the resistors R1 and R2 and the capacitor C1 storing the biasing voltage $V_+$ for the base circuit of the transistor.

The rectifying means, or diode $D_1$ will, in the ideal state, either be open circuited or short circuited. It will be appreciated from the circuit of FIG. 2 that if the lefthand terminal of diode $D_1$ is more positive than the right-hand terminal, the diode $D_1$ will present an open circuit to any signal appearing across the junction of resistances $R_1$ and $R_2$, so that that signal will not pass through the diode $D_1$ to the base of the transistor T. If, on the other hand, the signal appearing across the junction of resistor $R_1$ and resistor $R_2$, is more negative than the potential on the right terminal of diode $D_1$ as seen in FIG. 2, then the diode $D_1$ will act like a short circuit, and the signal will pass through to the base of the transistor T. On the other hand, the time constant of the resistor $R_6$ and capacitor $C_1$ is chosen so as to be relatively high compared to the highest frequency in the frequency range of the composite signal passing through the input terminal of the circuit shown in FIG. 2. By a suitable choice of the resistor values $R_1$, $R_2$, and $R_6$, and the value of the capacitor $C_1$, the transistor T can be appropriately biased.

In order to prevent the base current $I_B$ from tracking the signal current, a large time constant is selected for the resistor R6 and capacitor C1, with respect to the frequency of the input signal.

The resistor R6 is connected to a positive potential to maintain the diode D in the conducting state even if no input signal is present.

Generally, the circuit shown in FIG. 2 can be used between gain stages in order to amplify small signals associated with relatively high DC levels. The instant circuit will remove almost all of the DC component and leave the signal relatively unaffected so that it can be amplified in subsequent stages. This approach can be repeated as often as desired with practically no adverse effect on the quality of the signal, as long as the respective $I_{DC}$ currents are made less than or equal to the respective DC bias currents.

The use of variable gain amplifiers in connection with signal-derived control voltages enables the generation of special transfer characteristics so that the amplification of small signals can be achieved. A typical system is shown in FIG. 4. A signal from the driver stage 5 is connected to a coupling circuit 6 which can take the form of the circuit shown in FIG. 2. The circuit 6 reduces the DC component to a minimum level. The output signal from the circuit 6 connects to a variable gain stage which includes a variable gain amplifier 7 and a control signal circuit 8. Generally, the variable gain stage can be a peak voltage sampling circuit with feedback to amplify small signals to the greatest extent while large signals are substantially not amplified so that an equalization of signals is achieved. A coupling circuit 9 in the form of the circuit shown in FIG. 2 removes the DC component remaining in the signal coupled to an output amplifier 10.

I wish it to be understood that I do not wish to be limited to the exact details of construction shown and described, for obvious modifications will occur to a person skilled in the art.

Having thus described the invention, what I claim as new and desire to be secured by Letters Patent is as follows:

1. A coupling circuit for removing a DC component from a composite signal having a predetermined frequency range comprising, in combination:
    a transistor having a substantially constant DC output threshold for a variable drive signal at a predetermined operating region,
    biasing means connected to said transistor and operable for setting a controllable operating region defining said constant DC output threshold, said operating region corresponding substantially to said DC component of the composite signal, and being at least partially controllable by signals within said predetermined frequency range, and
    means for applying said composite signal as the driving signal to said transistor to remove from said composite signal said DC component lying below said threshold, and to pass the signal component exceeding said threshold, said biasing means having a relatively high time constant with respect to the highest frequency within the frequency range of said composite signal to minimize control of said operating region by said composite signal.

2. The coupling circuit as claimed in claim 1, wherein said circuit includes an input terminal, said transistor includes a biasing terminal, and said biasing means includes a divider circuit including first and second resistors connected between an operating voltage source of predetermined polarity and ground, and coupled to the biasing terminal of said transistor.

3. The coupling circuit as claimed in claim 2, further comprising rectifying means connected between said resistors so as to normally pass current therethrough, and coupled to the biasing terminal of said transistor.

4. The coupling circuit as claimed in claim 3, wherein said biasing means further comprises a third resistor connected to said input terminal and said rectifying means, and a capacitor coupled to the biasing terminal of said transistor and ground.

5. An electrical system comprising a coupling circuit as claimed in claim 1, further comprising two amplifiers, said coupling circuit coupling said amplifiers to each other.

* * * * *